United States Patent
Shu et al.

(10) Patent No.: US 10,784,195 B2
(45) Date of Patent: Sep. 22, 2020

(54) ELECTRICAL FUSE FORMATION DURING A MULTIPLE PATTERNING PROCESS

(71) Applicant: GLOBALFOUNDRIES Inc., Grand Cayman (KY)

(72) Inventors: Jiehui Shu, Clifton Park, NY (US); Xiaoqiang Zhang, Rexford, NY (US); Haizhou Yin, Clifton Park, NY (US); Moosung M. Chae, Englewood Cliffs, NJ (US); Jinping Liu, Ballston Lake, NY (US); Hui Zang, Guilderland, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/959,727

(22) Filed: Apr. 23, 2018

(65) Prior Publication Data

US 2019/0326209 A1 Oct. 24, 2019

(51) Int. Cl.
*H01L 23/528* (2006.01)
*H01L 21/768* (2006.01)
*H01L 23/525* (2006.01)

(52) U.S. Cl.
CPC ...... *H01L 23/528* (2013.01); *H01L 21/76877* (2013.01); *H01L 23/5256* (2013.01)

(58) Field of Classification Search
CPC ............... H01L 23/528; H01L 23/5256; H01L 21/76877
See application file for complete search history.

(56) References Cited

U.S. PATENT DOCUMENTS

| | | | |
|---|---|---|---|
| 7,381,594 B2 | 6/2008 | Hsu et al. | |
| 9,177,797 B2 | 11/2015 | Chang et al. | |
| 9,711,447 B1 | 7/2017 | Shu et al. | |
| 9,768,276 B2 | 9/2017 | He et al. | |
| 2009/0256235 A1* | 10/2009 | Takaoka ............ | H01L 23/5256 257/529 |
| 2009/0302417 A1* | 12/2009 | Kim ................... | H01L 23/5256 257/529 |
| 2010/0032797 A1* | 2/2010 | Takewaki .......... | H01L 23/5256 257/529 |
| 2010/0059823 A1 | 3/2010 | Chung et al. | |
| 2010/0117190 A1 | 5/2010 | Chuang et al. | |

(Continued)

FOREIGN PATENT DOCUMENTS

CN 101673738 A 3/2010
TW 201019456 A 5/2010

OTHER PUBLICATIONS

Taiwan Intellectual Property Office, Official Action dated Mar. 11, 2020 issued in Taiwanese Patent Application No. 108110069.

*Primary Examiner* — Dale E Page
*Assistant Examiner* — Quovaunda Jefferson
(74) *Attorney, Agent, or Firm* — Thompson Hine LLP; Anthony Canale

(57) ABSTRACT

Interconnect structures and methods of fabricating an interconnect structure. A first interconnect and a second interconnect extend in a first direction in a interlayer dielectric layer and are spaced apart from each other. A third interconnect is arranged in the interlayer dielectric layer to connect the first interconnect with the second interconnect. The first interconnect and the second interconnect have a first width, and the third interconnect has a second width that is less than the first width.

17 Claims, 6 Drawing Sheets

(56) References Cited

U.S. PATENT DOCUMENTS

| | | | |
|---|---|---|---|
| 2011/0018092 A1* | 1/2011 | Oshima | H01L 23/5256 |
| | | | 257/529 |
| 2015/0340233 A1 | 11/2015 | Huang et al. | |
| 2016/0240472 A1* | 8/2016 | Lin | H01L 21/76802 |
| 2017/0018504 A1* | 1/2017 | Byun | H01L 23/5286 |

* cited by examiner

ELECTRICAL FUSE FORMATION DURING A MULTIPLE PATTERNING PROCESS

BACKGROUND

The present invention relates to integrated circuits and semiconductor device fabrication and, more specifically, to interconnect structures and methods of fabricating an interconnect structure.

A back-end-of-line (BEOL) interconnect structure may be used to connect device structures fabricated on a substrate during front-end-of-line (FEOL) processing with each other and with the environment external to the chip. Self-aligned multiple patterning processes used to form a BEOL interconnect structure may involve mandrels formed as sacrificial features that establish a feature pitch. Sidewall spacers may be formed adjacent to the sidewalls of the mandrels. After selective removal of the mandrels, the sidewall spacers are used as an etch mask to etch an underlying hardmask over areas exposed by the mandrel pull and over exposed areas between the sidewall spacers that define non-mandrel lines. The pattern is transferred from the hardmask to an interlayer dielectric layer and defines trenches in which the wires of the BEOL interconnect structure are formed.

Cuts may be formed in the mandrels in order to section the mandrels and define discontinuities between sections that subsequently are used to form adjacent wires that are spaced apart at their tips with an end-to-end spacing. Similar cuts may also be formed in the hardmask itself along the non-mandrel lines. A pattern reflecting the mandrel lines, the non-mandrel lines, and the cuts is transferred to the hardmask and subsequently from the hardmask to form the trenches in the interlayer dielectric layer.

Electrical fuses may include an anode, a cathode, and a fuse link connecting the anode and cathode. Electrical fuses are fabricated as closed circuits, and may be dynamically programmed by passing an electrical current of relatively high current density through the fuse link. Generally, the electrical resistance of the programmed electrical fuse is larger and, in most instances, significantly larger than the electrical resistance of the intact electrical fuse. Among other uses, electrical fuses may be programmed to replace defective circuit elements with redundant circuit elements or may be programmed to alter circuit connections.

Improved interconnect structures and methods of fabricating an interconnect structure are needed.

SUMMARY

In an embodiment of the invention, an interconnect structure includes an interlayer dielectric layer, a first interconnect extending in a first direction in the interlayer dielectric layer, a second interconnect extending in the first direction in the interlayer dielectric layer and spaced from the first interconnect, and a third interconnect arranged in the interlayer dielectric layer to connect the first interconnect with the second interconnect. The first interconnect and the second interconnect have a first width, and the third interconnect has a second width that is less than the first width.

In an embodiment of the invention, a method includes forming a first mandrel line extending in a first direction over an interlayer dielectric layer, cutting the first mandrel line into a first section and a second section separated from the first section by a gap, and forming a first sidewall spacer on the first section of the first mandrel line and a second sidewall spacer on the second section of the first mandrel line that are spaced apart inside the first gap by a connecting line that connects a first non-mandrel line and a second non-mandrel line flanking the first mandrel line. The method further includes transferring the first non-mandrel line, the second non-mandrel line, and the connecting line to a first trench, a second trench, and a third trench in the interlayer dielectric layer, and filling the first trench, the second trench, and the third trench with conductor. The conductor in the first trench defines a first interconnect, and the conductor in the second trench defines a second interconnect. The first interconnect and the second interconnect have a first width. The conductor in the third trench defines a third interconnect having a second width that is less than the first width.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
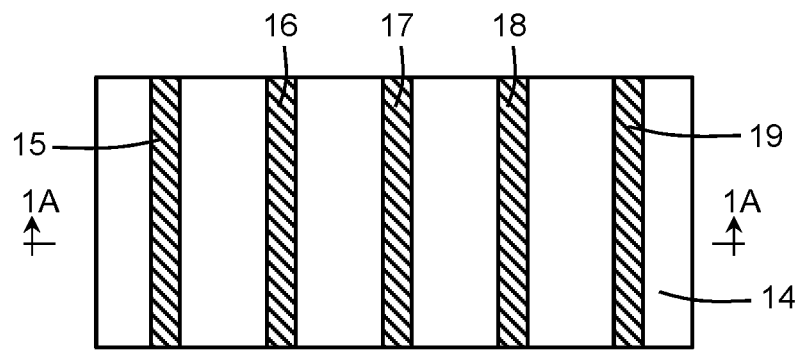
FIG. 1 is a top view of a structure at an initial fabrication stage of a processing method in accordance with embodiments of the invention.
Figure 1A:
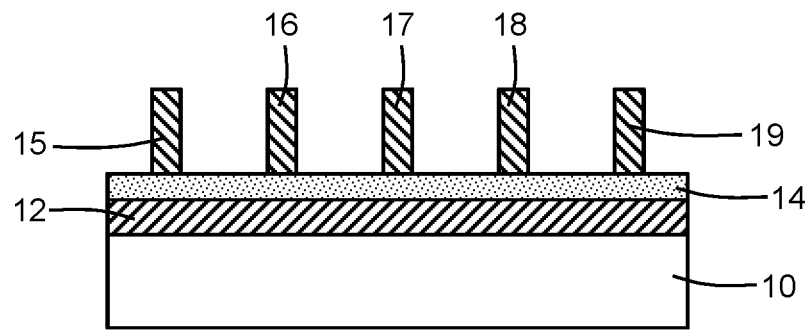
FIG. 1A is a cross-sectional view of the structure of FIG. 1 taken generally along line 1A-1A.

With reference to FIGS. 1, 1A and in accordance with embodiments of the invention, an interlayer dielectric layer 10 may be comprised of an electrically-insulating dielectric material, such as hydrogen-enriched silicon oxycarbide (Si-COH) or another type of low-k dielectric material. The interlayer dielectric layer 10 may be located on a substrate that includes device structures fabricated by front-end-of-line (FEOL) processing to form an integrated circuit. A hardmask is arranged over the interlayer dielectric layer 10 and includes a stack of individual hardmask layers 12, 14.

The hardmask layer 12 is formed on the top surface of the interlayer dielectric layer 10. The hardmask layer 12 may be comprised of a metal, such as titanium nitride (TiN), deposited by physical vapor deposition (PVD). The hardmask layer 12 is removable from the interlayer dielectric layer 10 selective to the material of the interlayer dielectric layer 10. As used herein, the term "selective" in reference to a material removal process (e.g., etching) denotes that the material removal rate (i.e., etch rate) for the targeted material is higher than the material removal rate (i.e., etch rate) for at least another material exposed to the material removal process.

The hardmask layer 14 is formed on a top surface of the hardmask layer 12. The hardmask layer 14 may be comprised of a dielectric material, such as silicon nitride ($Si_3N_4$), deposited by chemical vapor deposition (CVD). In an alternative embodiment, the hardmask layer 14 may be comprised of a different dielectric material, such as silicon dioxide ($SiO_2$). The material constituting the hardmask layer 14 is chosen to be removable from the hardmask layer 12 selective to the material of the hardmask layer 12.

Mandrel lines 15, 16, 17, 18, 19 are formed on a top surface of the hardmask layer 14. The mandrel lines 15, 16, 17, 18, 19 may be formed by depositing a blanket layer of a sacrificial material, such as amorphous silicon (α-Si), and patterning the blanket layer with using a self-aligned multiple patterning process, such as self-aligned double pattern (SADP) or self-aligned quadruple pattern (SAQP).

Figure 2:
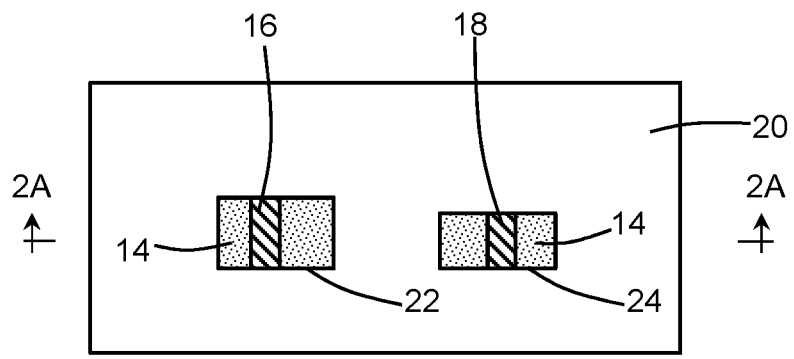
FIG. 2 is a top view of the structure at a fabrication stage of the processing method subsequent to FIGS. 1, 1A.
Figure 2A:
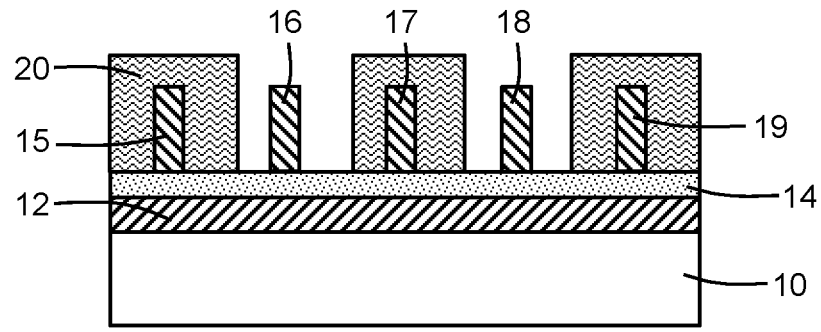
FIG. 2A is a cross-sectional view of the structure of FIG. 2 taken generally along line 2A-2A.

With reference to FIGS. 2, 2A in which like reference numerals refer to like features in FIG. 1 and at a subsequent fabrication stage of the processing method, an etch mask 20 is applied over the hardmask layer 14 and mandrel lines 15, 16, 17, 18, 19, and is patterned by lithography to define openings 22, 24. The etch mask 20 may include, for example, an organic planarization layer, an anti-reflective coating, a hardmask, and/or a layer of photoresist. A section of mandrel line 16 and a section of mandrel line 18 are respectively exposed by the openings 22, 24 in the etch mask 20. The opening 22 in the etch mask 20 is larger in dimensions than the opening 24 in the etch mask 20 and, in particular, the dimension of the opening 22 along the length of the mandrel line 16 is larger than the dimension the opening 22 along the length of the mandrel line 18.

Figure 3:
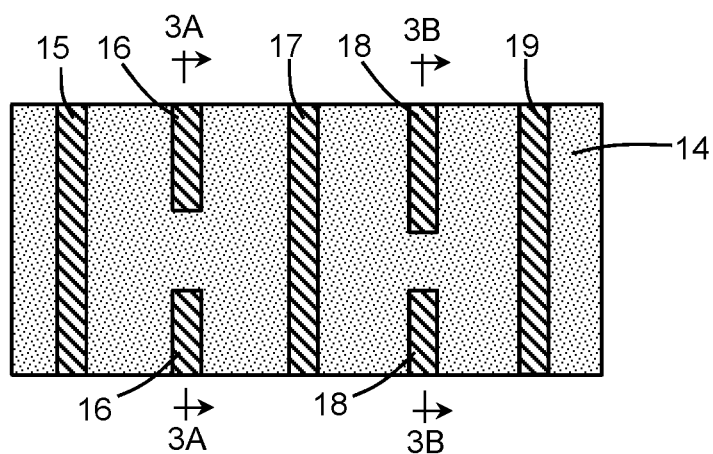
FIG. 3 is a top view of the structure at a fabrication stage of the processing method subsequent to FIGS. 2, 2A.
Figure 3A:
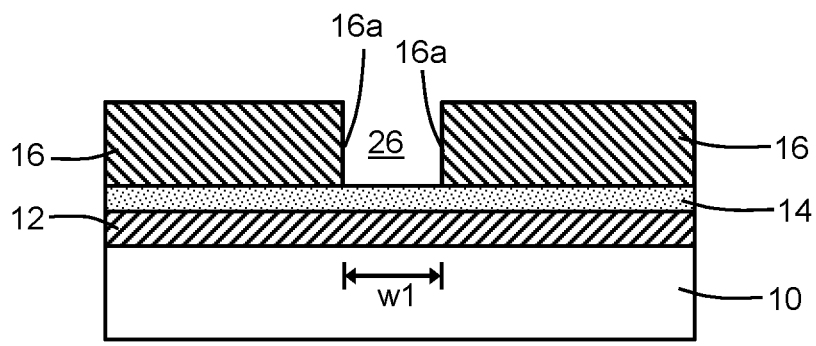
FIG. 3A is a cross-sectional view of the structure of FIG. 3 taken generally along line 3A-3A.
Figure 3B:
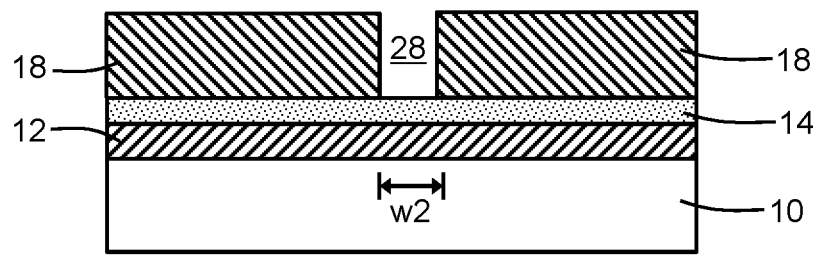
FIG. 3B is a cross-sectional view of the structure of FIG. 3 taken generally along line 3B-3B.

With reference to FIGS. 3, 3A, 3B in which like reference numerals refer to like features in FIGS. 2, 2A and at a subsequent fabrication stage of the processing method, the sections of the mandrel line 16 exposed by opening 22 in the etch mask 20 and the mandrel line 18 exposed by opening 24 in the etch mask 20 are removed by an etching process to form respective mandrel cuts 26, 28 and the etch mask 20 is removed. The etching process may rely on an etch chemistry that removes the material of the mandrel lines 16, 18 selective to the material of the hardmask layer 14.

The mandrel line 18 is divided into discontinuous sections with tips or ends that are separated by the mandrel cut 28 with a given end-to-end distance. The mandrel line 16 is divided into discontinuous sections with tips or ends that are separated by the mandrel cut 26 with an end-to-end distance that is greater than the end-to-end distance separating the ends of the sections of the mandrel line 18. Specifically, the dimensions of the mandrel cuts 26, 28 are selected such that the width w1 of the mandrel cut 26 between the ends 16a of the sections of mandrel line 16 is larger than the width w2 of the mandrel cut 28 between the ends of the sections of the mandrel line 18. The photomask used during lithography to form the openings 22, 24 in the etch mask 20 may be tailored to provide the different widths for mandrel cut 26 and mandrel cut 28. The same etch mask 20 is used to form the mandrel cut 26 and the mandrel cut 28, which are subsequently used in the process flow to respectively form a fuse link of an electrical fuse and to separate the ends of linearly-aligned interconnect lines. In that regard, the formation of the fuse link does not require an additional etch mask.

Figure 4A:
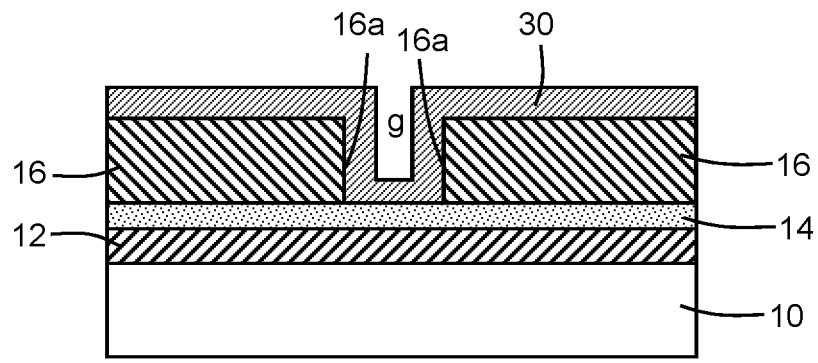
FIGS. 4A and 4B are cross-sectional views of the structure at a fabrication stage of the processing method subsequent to FIGS. 3A and 3B.
Figure 4B:
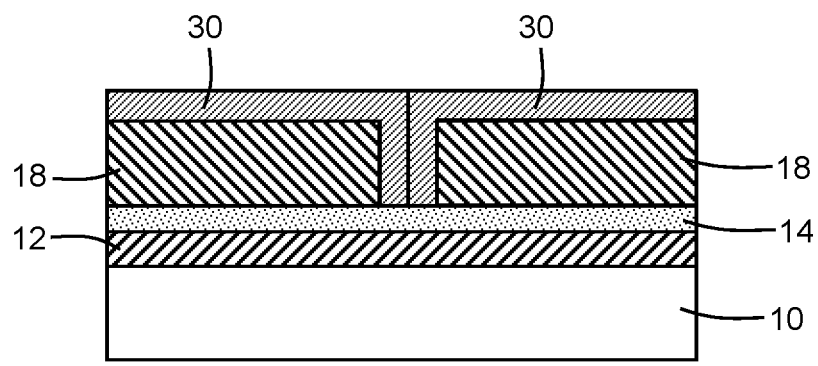

With reference to FIGS. 4A, 4B in which like reference numerals refer to like features in FIGS. 3A, 3B and at a subsequent fabrication stage of the processing method, a conformal layer 30 comprised of a dielectric material may be deposited using, for example, atomic layer deposition (ALD). The material constituting the conformal layer 30 may be chosen so as to be removed by a given etching process selective to the material of the mandrel lines 15, 16, 17, 18, 19. For example, the choice of the dielectric material constituting the conformal layer 30 may be silicon dioxide ($SiO_2$), and the choice of the sacrificial material constituting the mandrel lines 15, 16, 17, 18, 19 may be amorphous silicon (α-Si), which may be removed by an etching process selective to silicon dioxide.

The conformal layer 30 coats the exterior surfaces of the mandrel lines 15, 16, 17, 18, 19 and also at least partially fills each of the mandrel cuts 26, 28. In particular, due to its width and the chosen thickness for the conformal layer 30, the conformal layer 30 may fill and close the mandrel cut 28 by merging during deposition in the gap between the ends of the respective sections of the mandrel line 18. Full merger occurs because the width, w2, of the mandrel cut 28 is less than twice the deposited thickness of the conformal layer 30. However, the width, w1, of the mandrel cut 26 is greater than twice the deposited thickness of the conformal layer 30. As a result, the conformal layer 30 fails to merge and close the mandrel cut 28 during deposition in the gap between the ends of the respective sections of the mandrel line 16. The result of the partially filling is that a gap, g, is open between the sections of the conformal layer 30 on the ends of the respective sections of the mandrel line 16.

Figure 5:
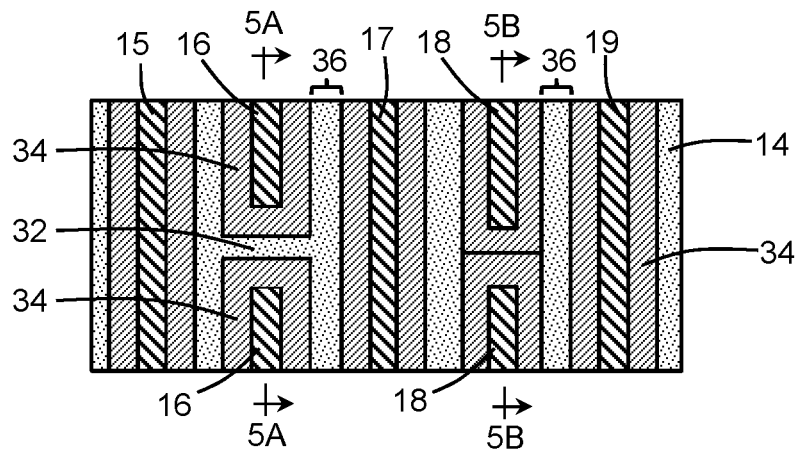
FIG. 5 is a top view of the structure at a fabrication stage of the processing method subsequent to FIGS. 4A, 4B.
Figure 5A:
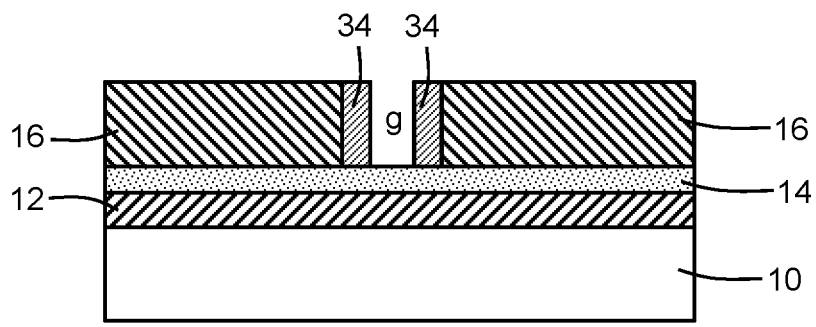
FIG. 5A is a cross-sectional view of the structure of FIG. 5 taken generally along line 5A-5A.
Figure 5B:
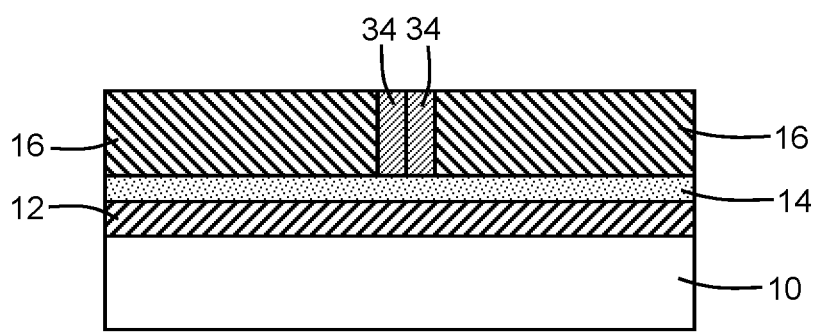
FIG. 5B is a cross-sectional view of the structure of FIG. 5 taken generally along line 5B-5B.

With reference to FIGS. 5, 5A, 5B in which like reference numerals refer to like features in FIGS. 4A, 4B and at a subsequent fabrication stage of the processing method, sidewall spacers 34 are formed from the conformal layer 30 and are arranged on the top surface of the hardmask layer 14 adjacent to the vertical sidewalls of the mandrel lines 15, 16, 17, 18, 19. The sidewall spacers 34 may be formed by shaping the conformal layer 30 with an anisotropic etching process, such as reactive ion etching (RIE). The respective top surfaces of the mandrel lines 15, 16, 17, 18, 19 are exposed following the etching process, and the mandrel cut 28 remains filled by the dielectric material of the sidewall spacers 34. The gap, g, persists between the sidewall spacers 34 formed from the conformal layer 30 inside the mandrel cut 26, and an area on the top surface of the hardmask layer 14 is exposed between the sidewall spacers 34 in the gap that represents a connecting line 32.

The spacer-formation etching process also removes sections of the conformal layer 30 between the sidewall spacers 34 so as to expose areas on the top surface of the hardmask layer 14 that represent non-mandrel lines 36. The connecting line 32 is arranged between the ends 16a of the sections of the mandrel line 16 and extends transverse to the length of the mandrel lines 15, 16, 17, 18, 19 between the non-mandrel lines 36 arranged on opposite sides of the spacer-clad mandrel line 16. After the formation of the sidewall spacers 34, non-mandrel cuts (not shown) may also be formed in the hardmask layer 14 over areas between the mandrel lines 15, 16, 17, 18, 19.

Figure 6:
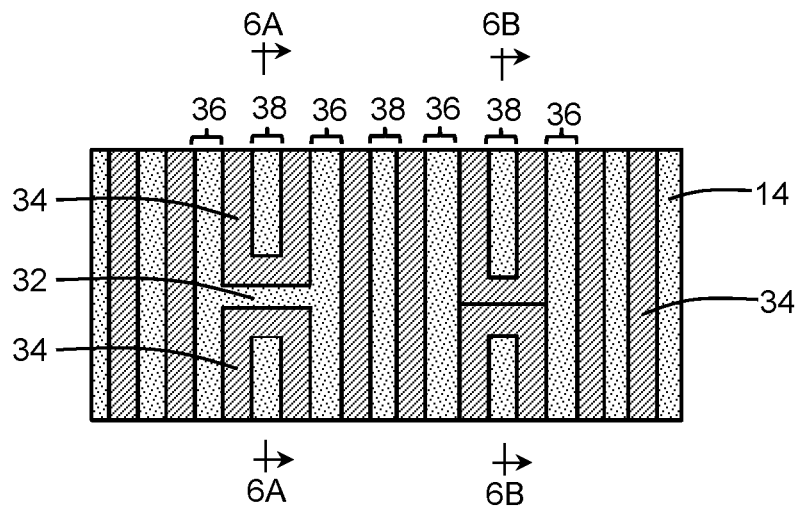
FIG. 6 is a top view of the structure at a fabrication stage of the processing method subsequent to FIGS. 5, 5A, 5B.
Figure 6A:
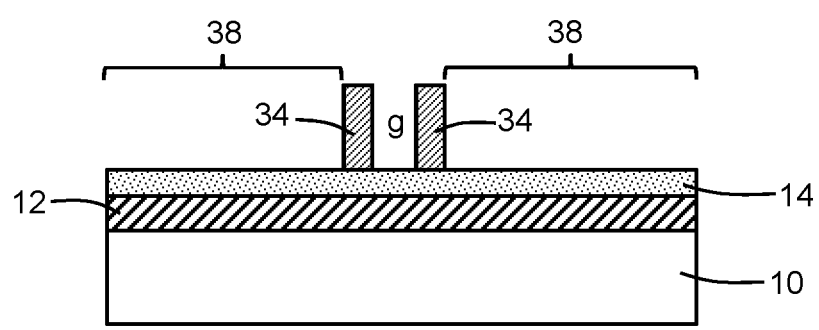
FIG. 6A is a cross-sectional view of the structure of FIG. 6 taken generally along line 6A-6A.
Figure 6B:
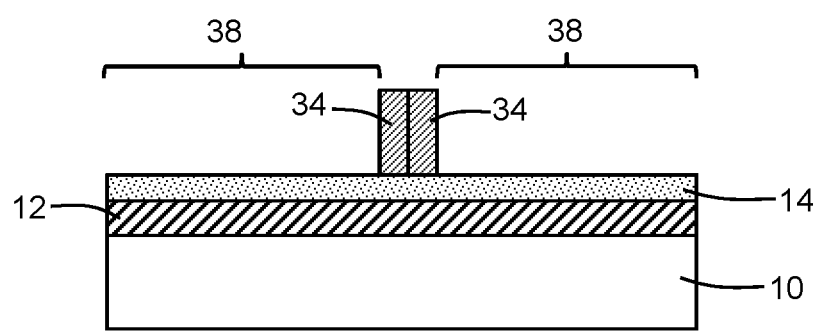
FIG. 6B is a cross-sectional view of the structure of FIG. 6 taken generally along line 6B-6B.

With reference to FIGS. 6, 6A, 6B in which like reference numerals refer to like features in FIGS. 5, 5A, 5B and at a subsequent fabrication stage of the processing method, the mandrel lines 15, 16, 17, 18, 19 are removed by an etching process selective to the materials of the sidewall spacers 34 and hardmask layer 14. Areas on the top surface of the hardmask layer 14 are revealed by the mandrel pull and define mandrel lines 38. The mandrel lines 38 are interdigitated with the non-mandrel lines 36 such that the different types of lines alternate in a spaced arrangement.

Figure 7:
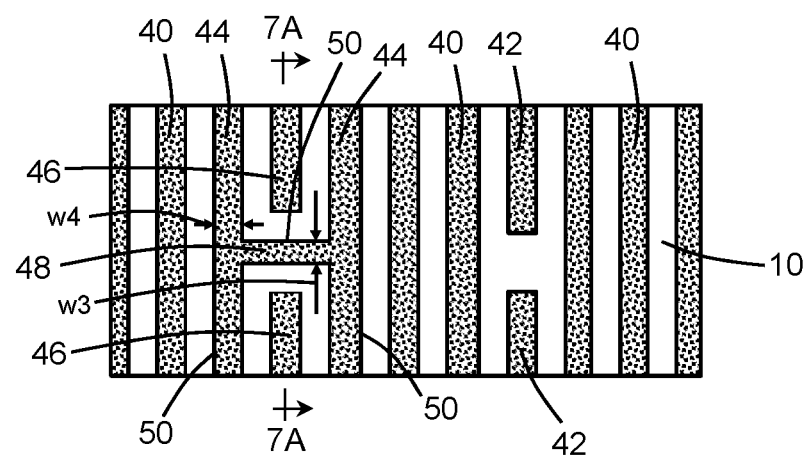
FIG. 7 is a top view of the structure at a fabrication stage of the processing method subsequent to FIGS. 6, 6A, 6B.
Figure 7A:
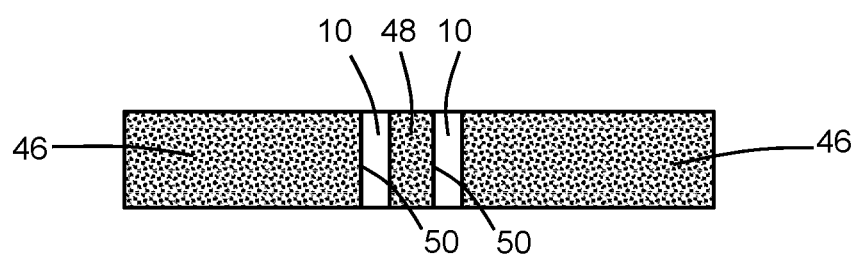
FIG. 7A is a cross-sectional view of the structure of FIG. 7 taken generally along line 7A-7A.

With reference to FIGS. 7, 7A in which like reference numerals refer to like features in FIGS. 6, 6A, 6B and at a subsequent fabrication stage of the processing method, interconnects 40, 42, 44, 46 and a fuse link 48 are formed in the interlayer dielectric layer 10. To that end, the hardmask layer 14 is patterned by an etching process with the sidewall spacers 34 operating as an etch mask. The hardmask layer 12 is subsequently patterned by an etching process with the patterned hardmask layer 14 operating as an etch mask to transfer the pattern of the non-mandrel lines 36, mandrel lines 38, and connecting line 32 to the hardmask layer 12. The hardmask layer 14 and the sidewall spacers 34 may be removed after the hardmask layer 12 is patterned.

The interlayer dielectric layer 10 is etched using the patterned hardmask layer 12 as an etch mask to form trenches 50 in the interlayer dielectric layer 10. After the interlayer dielectric layer 10 is etched, the hardmask layer 12 may be selectively removed by an etching or cleaning process. The trenches 50 in the interlayer dielectric layer 10 are then filled with a conductor to form the interconnects 40, 42, 44, 46 and fuse link 48 that are contained in a metallization level of an interconnect structure. A liner (not shown) comprised of titanium (Ti), titanium nitride (TiN), tantalum (Ta), tantalum nitride (TaN), or a layered combination of these materials (e.g., a bilayer of Ti/TiN) may be applied to the trenches 50 before filling with the metal. The interconnects 40, 42, 44, 46 and fuse link 48 may be comprised of a low-resistivity metal, such as copper (Cu), aluminum (Al), or cobalt (Co).

The shapes and geometries of the interconnects 40, 42, 44, 46 and fuse link 48 reproduce the shapes and geometries of the connecting line 32, non-mandrel lines 36, and mandrel lines 38, and the interconnects 40, 42, 44, 46 and fuse link 48 have the same thickness. Adjacent pairs of interconnects 40, 42, 44, 46 are separated from each other in one lateral direction by respective strips of the electrical insulator constituting the interlayer dielectric layer 10 and that correspond in location to the spaces between adjacent pairs of non-mandrel lines 36 and mandrel lines 38. The interconnects 40 are not broken by either mandrel or non-mandrel cuts. The interconnects 42 are separated with a given end-to-end distance between their respective ends by a section of the interlayer dielectric layer 10 formed with the dimensions of the mandrel cut 28.

The interconnects 46 are separated with a given end-to-end distance between their respective ends by a section of the interlayer dielectric layer 10 formed with the dimensions of the mandrel cut 26. The fuse link 48 is arranged laterally between the ends of the interconnects 46, and extends laterally along its length as a connecting interconnect from one of the interconnects 44 to another of the interconnects 44. The length of the fuse link 48 is aligned transverse to the length of the interconnects 44.

The interconnects 44 and the fuse link 48 define an electrical fuse in which the interconnects 44 provide an anode and cathode as electrodes of the electrical fuse. The width, w3, of the fuse link 48 may be less than the width, w4, of the interconnects 44. In an embodiment, the width, w3, of the fuse link 48 may be less than or equal to 50% (i.e., one half) of the width, w4, of the interconnects 44 and greater than or equal to 25 percent (i.e., one quarter) of the width, w4. In a numerical example, the fuse link 48 may have a width, w3, in a range of five (5) nanometers to ten (10) nanometers and the interconnects 44 may have a width, w4, equal to twenty (20) nanometers. The fuse link 48 and interconnects 44 of the electrical fuse are arranged in a single metallization level, which contrasts with conventional BEOL fuses that position the electrodes and fuse link with a vertical arrangement in three different metallization levels.

In use, the electrical fuse may be programmed by applying a bias potential in a pulse train or as a single pulse of a lengthier duration between the interconnects 44 defining the electrodes. The identification of interconnects 44 as the anode and cathode is contingent upon the polarity of the bias potential applied to the electrical fuse during programming. The bias potential can be controlled through the size (i.e., cross-sectional area and length) of the fuse link 48, which is determined by the size of the mandrel cut 26 and the spacer thickness. The electrical current flows through the fuse link 48 with a higher density than the electrical current flowing in the interconnects 44 because of the smaller cross-sectional area of the fuse link 48. As electrical current flows through the fuse link 48, the temperature of the fuse link 48 is elevated by Joule heating. The elevated temperature combined with the high current density promotes electromigration of the conductive material of the fuse link 48. The result is that the fuse link 48 physically changes from a low resistance state, when intact and prior to programming, to a high resistance state after programming.

Although described herein in connection with the formation of an electrical fuse, a person having ordinary skill in the art will appreciate that the arrangement of interconnects may have other applications in double patterning processes, such as self-aligned double patterning (SADP) and self-aligned quadruple patterning (SAQP) processes.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An interconnect structure comprising:
   an interlayer dielectric layer including a first trench extending in a first direction, a second trench extending in the first direction, and a third trench connecting the first trench with the second trench, the first trench being laterally spaced from the second trench with the third trench located between the first trench and the second trench;
   a first interconnect in the first trench;
   a second interconnect in the second trench;
   a third interconnect in the third trench, the third interconnect connecting the first interconnect with the second interconnect;
   a fourth interconnect extending in the first direction in the interlayer dielectric layer between the first interconnect and the second interconnect, the fourth interconnect having an end; and
   a fifth interconnect extending in the first direction in the interlayer dielectric layer between the first interconnect and the second interconnect, the fifth interconnect having an end,
   wherein the interlayer dielectric layer, the first interconnect, the second interconnect, and the third interconnect are coplanar, the third interconnect is arranged in the first direction between the end of the fourth interconnect and the end of the fifth interconnect, the interlayer dielectric layer includes a first portion between the third interconnect and the end of the fourth interconnect, and the interlayer dielectric layer includes a second portion between the third interconnect and the end of the fifth interconnect, the first interconnect and the second interconnect have a first width, and the third interconnect has a second width that is less than the first width.

2. The interconnect structure of claim 1 wherein the third interconnect extends in a second direction relative to the first interconnect and the second interconnect, and the second direction is transverse within a plane to the first direction.

3. The interconnect structure of claim 2 wherein the first interconnect and the second interconnect are laterally arranged within the plane along parallel lines in the first direction.

4. The interconnect structure of claim 1 wherein the second width is less than or equal to 50 percent of the first width, and the second width is greater than or equal to 25 percent of the first width.

5. The interconnect structure of claim 1 wherein the first interconnect, the second interconnect, and the third interconnect have the same thickness.

6. The interconnect structure of claim 1 wherein the first interconnect and the second interconnect have a first cross-sectional area based in part on the first width, the third interconnect has a second cross-sectional area based in part on the first width, the second cross-sectional area is less than the first cross-sectional area, and the first interconnect, the second interconnect, and the third interconnect are comprised of sections of the same conductor layer.

7. The interconnect structure of claim 1 wherein the first interconnect is a first electrode of an electrical fuse, the second interconnect is a second electrode of the electrical fuse, and the third interconnect is a fuse link arranged to connect the first electrode with the second electrode.

8. The interconnect structure of claim 1 wherein the interlayer dielectric layer, the first interconnect, the second interconnect, and the third interconnect are arranged in a single metallization level.

9. The interconnect structure of claim 1 wherein the third interconnect has a length that extends in a second direction relative to a length of the first interconnect and the second interconnect, and the second direction is transverse within a plane to the first direction.

10. The interconnect structure of claim 1 wherein the first interconnect, the second interconnect, and the third interconnect are comprised of a metal.

11. The interconnect structure of claim 1 wherein the first interconnect, the second interconnect, and the third interconnect are comprised of copper (Cu), aluminum (Al), or cobalt (Co).

12. The interconnect structure of claim 1 wherein the third interconnect has a width in a range of five (5) nanometers to ten (10) nanometers.

13. The interconnect structure of claim 12 wherein the first interconnect and the second interconnect have a width equal to twenty (20) nanometers.

14. The interconnect structure of claim 1 wherein the interlayer dielectric layer, the first interconnect, the second interconnect, the third interconnect, the fourth interconnect, and the fifth interconnect are arranged in a single metallization level.

15. The interconnect structure of claim 1 wherein the first interconnect, the second interconnect, and the third interconnect are comprised of a metal.

16. The interconnect structure of claim 1 wherein the first interconnect, the second interconnect, the third interconnect, the fourth interconnect, and the fifth interconnect are comprised of copper (Cu), aluminum (Al), or cobalt (Co).

17. The interconnect structure of claim 1 wherein the interlayer dielectric layer, the first interconnect, the second interconnect, the third interconnect, the fourth interconnect, and the fifth interconnect have the same thickness.

* * * * *